(12) United States Patent
Nakata

(10) Patent No.: US 7,238,966 B2
(45) Date of Patent: Jul. 3, 2007

(54) LIGHT-RECEIVING PANEL OR LIGHT-EMITTING PANEL, AND MANUFACTURING METHOD THEREOF

(76) Inventor: Josuke Nakata, 29-3, Goryoooeyama-cho, 4-chome, Nishikyo-ku, Kyoto-shi (JP) 610-1102

( * ) Notice: Subject to any disclaimer, the term of this patent is extended or adjusted under 35 U.S.C. 154(b) by 119 days.

(21) Appl. No.: 10/511,958

(22) PCT Filed: May 2, 2002

(86) PCT No.: PCT/JP02/04415

§ 371 (c)(1),
(2), (4) Date: Nov. 10, 2004

(87) PCT Pub. No.: WO03/094248

PCT Pub. Date: Nov. 13, 2003

(65) Prior Publication Data

US 2006/0043390 A1   Mar. 2, 2006

(51) Int. Cl.
*H01L 28/18* (2006.01)
(52) U.S. Cl. .......................... 257/88; 257/81
(58) Field of Classification Search .................. 257/80, 257/81, 83, 84, 431, 433, 434, 436, 459
See application file for complete search history.

(56) References Cited

U.S. PATENT DOCUMENTS

| | | |
|---|---|---|
| 3,038,952 A | 6/1962 | Ralph |
| 3,350,775 A | 11/1967 | Iles |
| 3,433,676 A | 3/1969 | Stein |
| 3,998,659 A | 12/1976 | Wakefield |
| 4,021,323 A | 5/1977 | Kilby et al. |
| 4,126,812 A | 11/1978 | Wakefield |
| 4,224,081 A | 9/1980 | Kawamura et al. |
| 4,521,640 A | 6/1985 | Levine |
| 4,581,103 A | 4/1986 | Levine et al. |

(Continued)

FOREIGN PATENT DOCUMENTS

EP   0 866 506   9/1998

(Continued)

OTHER PUBLICATIONS

U.S. Appl. No. 10/169,017, filed Oct. 7, 2002, Nakata.

*Primary Examiner*—Wai-Sing Louie
*Assistant Examiner*—Mursalin B. Hafiz
(74) *Attorney, Agent, or Firm*—Jordan and Hamburg LLP

(57) ABSTRACT

A light receiving panel provided with a plurality of particulate semiconductor elements (solar cells) or a light emitting panel provided with a plurality of particulate semiconductor elements (light emitting diodes) is disclosed. In the solar cell panel, a printed wiring sheet is constructed by forming printed wiring and retaining holes in the form of a matrix with a plurality of rows and a plurality of columns in a printed wiring sheet material made of a thin transparent synthetic resin; a plurality of solar cells are respectively mounted in the plurality of retaining holes, these cells are resin-sealed by a transparent synthetic resin material, a positive pole terminal and negative pole terminal exposed to the outside are formed, and a plurality of solar cell panels are constructed so that series connection, parallel connection or series-parallel connection is possible. The solar cell panel may also be constructed so that deformation in the manner of two dimensional or three dimensional curved surface is possible.

20 Claims, 12 Drawing Sheets

U.S. PATENT DOCUMENTS

| | | | |
|---|---|---|---|
| 4,582,588 | A | 4/1986 | Jensen et al. |
| 4,583,588 | A | 4/1986 | Franzolini et al. |
| 4,691,076 | A | 9/1987 | Levine et al. |
| 5,028,546 | A | 7/1991 | Hotchkiss |
| 5,419,782 | A | 5/1995 | Levine et al. |
| 5,428,249 | A | 6/1995 | Sawayama et al. |
| 5,431,127 | A | 7/1995 | Stevens et al. |
| 5,469,020 | A | 11/1995 | Herrick |
| 5,538,902 | A | 7/1996 | Izu et al. |
| 6,204,545 | B1 | 3/2001 | Nakata |
| 6,265,242 | B1 | 7/2001 | Komori et al. |
| 6,294,822 | B1 | 9/2001 | Nakata |
| 6,355,873 | B1 * | 3/2002 | Ishikawa .................. 136/250 |
| 6,706,959 | B2 * | 3/2004 | Hamakawa et al. ........ 136/250 |
| 6,744,073 | B1 | 6/2004 | Nakata |
| 7,109,528 | B2 | 9/2006 | Nakata |
| 2004/0238833 | A1 | 12/2004 | Nakata |
| 2005/0127379 | A1 | 6/2005 | Nakata |
| 2006/0043390 | A1 | 3/2006 | Nakata |
| 2006/0086384 | A1 | 4/2006 | Nakata |
| 2006/0133073 | A1 | 6/2006 | Nakata et al. |
| 2006/0169992 | A1 | 8/2006 | Nakata |

FOREIGN PATENT DOCUMENTS

| | | |
|---|---|---|
| EP | 0 982 780 | 3/2000 |
| EP | 1 102 332 | 5/2001 |
| EP | 1 255 303 | 11/2002 |
| GB | 1195547 | 6/1970 |
| JP | 1-179374 | 7/1989 |
| JP | 5-36997 | 2/1993 |
| JP | 6-013633 | 1/1994 |
| JP | 8-199513 | 8/1996 |
| JP | 9-49213 | 2/1997 |
| JP | 9-162434 | 6/1997 |
| JP | 09-162434 | 6/1997 |
| JP | 10-33969 | 2/1998 |
| JP | 2000-22184 | 1/2000 |
| JP | 2000-259992 | 9/2000 |
| JP | 2001-210834 | 3/2001 |
| JP | 2001-102618 | 4/2001 |
| JP | 2001-119093 | 4/2001 |
| JP | 2001-156315 | 6/2001 |
| JP | 2001-168369 | 6/2001 |
| JP | 2001-177132 | 6/2001 |
| JP | 2001-210834 | 8/2001 |
| JP | 2001-210848 | 8/2001 |
| JP | 2001-267609 | 9/2001 |
| JP | 2002-50780 | 2/2002 |
| JP | 2002-164554 | 6/2002 |
| WO | WO-96/03775 | 2/1996 |
| WO | WO-98/15983 | 4/1998 |
| WO | WO-98/36461 | 8/1998 |

* cited by examiner

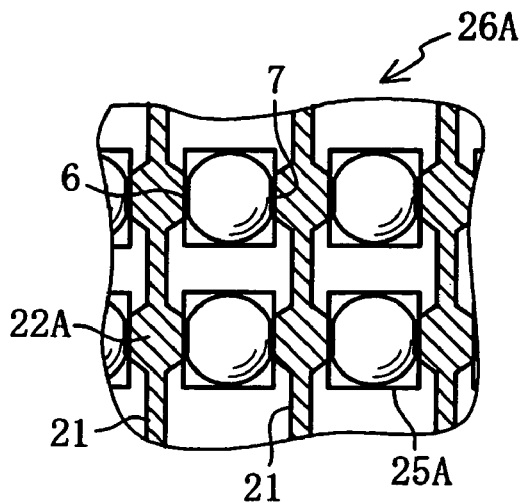
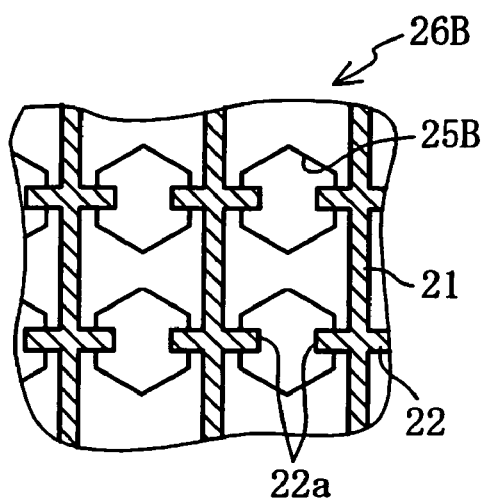
Fig. 16    Fig. 17
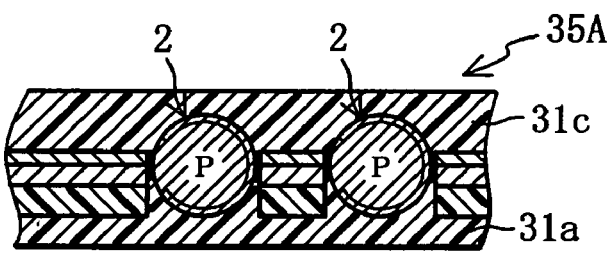
Fig. 18
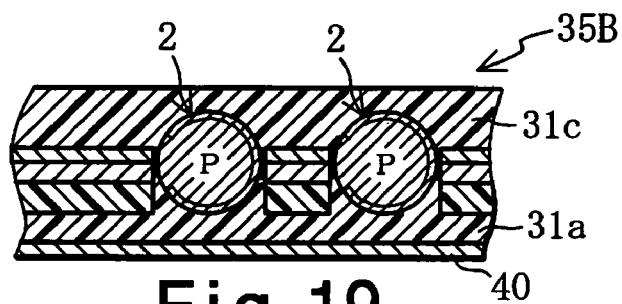
Fig. 19
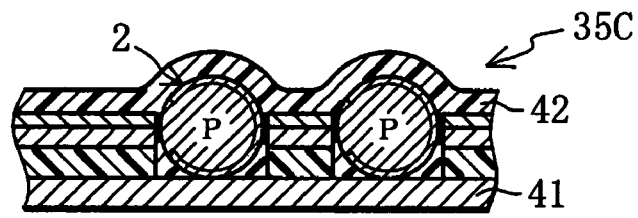
Fig. 20

LIGHT-RECEIVING PANEL OR LIGHT-EMITTING PANEL, AND MANUFACTURING METHOD THEREOF

TECHNICAL FIELD

The present invention relates to a light receiving or light emitting panel which can be simply manufactured by mounting light receiving elements or light emitting elements in a plurality of retaining holes formed in a printed wiring sheet, and then sealing these mounted elements with a resin, and a method of manufacturing such a panel.

BACKGROUND OF THE INVENTION

In a conventional solar cell, an n type diffusion layer is formed on the surface of a p type semiconductor substrate, a light receiving surface electrode with a herringbone pattern is formed on the front surface side, a back surface electrode is formed on the back surface side, and the overall device is constructed as a flat-plate panel structure. In such a flat-plate solar cell panel, when the angle of incidence of sunlight increases in the morning and evening, the proportion of reflected light increases, and the proportion of light that enters the panel drops.

Conventionally, therefore, various types of solar cell panels using solar cells comprising spherical semiconductor elements with a diameter of approximately 1 to 2 mm have been proposed. For example, in WO 98/15983, the present applicant proposed a solar cell and light emitting device comprising spherical semiconductor elements. In such devices, each spherical semiconductor element is provided with a diffusion layer, a pn junction and a pair of electrodes which are disposed on both ends of the semiconductor element with the center thereof interposed therebetween. Numerous solar cells of the abovementioned type are disposed in the form of a matrix having numerous rows and numerous columns, these solar cells are connected in series and parallel, and the cells are sealed in embedded form with a transparent synthetic resin, thus forming a solar cell panel. Since a pair of electrodes are formed on both ends, these solar cells are advantageous in the series connection of a plurality of solar cells; the arrangement of a plurality of solar cells in the form of a matrix, and the connection of these numerous solar cells in series and parallel, cannot be easily accomplished.

For example, the present applicant attempted series and parallel connections by disposing a plurality of solar cells in matrix form in a sandwich type configuration between two printed boards.

In this case, however, since numerous electrodes must be connected with a plurality of solar cells precisely positioned on a printed board, and numerous electrodes must be connected with another printed board superimposed on top of this assembly, the structure of the solar cell panel becomes complicated; furthermore, the size of the panel is increased, and the cost of parts and cost of assembly are increased, so that the manufacturing cost of the solar cell panel is increased.

Here, panels with various types of structures have been proposed as solar cell panels in which numerous spherical solar cells are disposed in the form of a matrix.

A solar cell panel in which numerous solar cells are connected in parallel via two sheets of aluminum foil is proposed in Japanese patent laid-open publication No. 6-13633.

In the solar cell panel (or solar cell sheet) described in Japanese patent laid-open publication No. 9-162434, a mesh is constructed from insulating warp filaments and first and second woof filaments on which different metal coating films are formed; furthermore, numerous spherical elements in which a diffusion layer is formed on the surface of a p type spherical single crystal silicon particulate are manufactured, these spherical elements are disposed in the respective eyes of the abovementioned mesh, the first woof filaments are connected to the diffusion layers, the second woof filaments are connected to the spherical single crystal silicon particulate, and these particulates are sealed by means of a synthetic resin.

In the case of this solar cell panel, the manufacture of the mesh having a special structure is not easy, and the manufacturing cost is also high; however, a solar cell panel (or solar cell sheet) can be manufactured continuously and inexpensively by means of an automated apparatus.

In the optical power generating panel described in Japanese patent laid-open publication No. 2001-210834, numerous spherical elements in which a diffusion layer is formed on the surface of a p type or n type spherical crystalline silicon particulate are manufactured, these spherical elements are inserted into numerous holes formed in a printed board, printed wiring is connected to the diffusion layers of the numerous spherical elements, the diffusion layers of the numerous spherical elements are then removed by etching on the back surface side of the printed board, the printed board in which the numerous spherical elements are incorporated is placed on top of another printed board, and the spherical crystals of the respective spherical elements are connected to the printed wiring. In this optical power generating panel, since numerous spherical power generating elements are connected in parallel, the electromotive force of a single optical power generating panel cannot be increased, and since two printed boards are used, the cost of parts and the assembly cost are high, so that the manufacturing cost of the optical power generating panel is also increased. Since two printed boards are used, the rigidity of the panel tends to be high, so that it is difficult to construct a flexible optical power generating panel. In all of the abovementioned devices, the spacing between electrodes becomes smaller as the spherical diameter is reduced, so that a reduction in size is hindered.

Objects of the present invention are to provide a light receiving or light emitting panel in which numerous spherical semiconductor elements, each of which has a pair of electrodes facing each other across the center, are electrically connected by means of a single printed wiring sheet, to provide a light receiving or light emitting panel that possesses flexibility, to provide a light receiving or light emitting panel that can be constructed as a thin type panel with a simple structure, and to provide a light receiving or light emitting panel in which the numerous spherical semiconductor elements can be connected by a desired connecting system selected from series connection, parallel connection and series-parallel connection.

DISCLOSURE OF THE INVENTION

The light receiving or light emitting panel according to the present invention is a light receiving or light emitting panel in which a plurality of particulate semiconductor elements that have a light-to-electricity transducing function or electricity-to-light transducing function are incorporated in a planar fashion, characterized in that a light transmitting printed wiring sheet that is used to position, hold and electrically connect the plurality of semiconductor elements is provided, and the printed wiring sheet comprises a plurality of retaining holes disposed in a form of a matrix having a plurality of rows and a plurality of columns, through which a plurality of semiconductor elements are passed, and which hold intermediate parts in a height direction of the semiconductor elements, and printed wiring which is formed on the surface of the printed wiring sheet, and which electrically connects the plurality of semiconductor elements.

In this light receiving or light emitting panel, since numerous semiconductor elements are incorporated on one printed wiring sheet, with intermediate parts in the direction of height of the respective semiconductor elements being held by the retaining holes, and since the pairs of electrodes of the respective semiconductor elements are connected to the printed wiring, the installation, positioning and electrical connection of the numerous semiconductor elements can easily be accomplished. Since a single printed wiring sheet is incorporated in substantially an intermediate position in the direction of thickness of the light receiving or light emitting panel, the thickness of the light receiving or light emitting panel can be reduced compared to cases in which a pair of printed wiring sheets are disposed on both the upper and lower sides of the numerous semiconductor elements, and the amount of synthetic resin material that is used for the resin sealing of the semiconductor elements can be reduced, so that the light receiving or light emitting panel can be made thinner and lighter, and the manufacturing cost can be reduced.

Besides having a flat-plate structure, this light receiving or light emitting panel can also be constructed as a structure that can be deformed in the manner of a two dimensional or three dimensional curved surface; accordingly, this light receiving or light emitting panel is superior in terms of all-purpose applicability.

If preferable, various constructions such as those described below can be used in the present invention.

(a) A transparent covering material that covers the printed wiring sheet and the plurality of semiconductor elements held on the printed wiring sheet in embedded form is provided.

(b) The printed wiring sheet is constructed by a thin sheet material made of a transparent hard synthetic resin.

(c) The covering material is formed by a soft synthetic resin material, and the abovementioned panel is constructed with a structure that is deformable in the manner of a two dimensional or three dimensional curved surface (d) The covering material is formed by a hard synthetic resin material, and the abovementioned panel is constructed with a hard flat-plate structure.

(e) The semiconductor elements each comprise a spherical element main body made of a p type or n type semiconductor, a pn junction, and a pair of electrodes that are formed on both end parts with the center of the element main body interposed, and that are connected to both ends of the pn junction, and the pair of electrodes are connected to the printed wiring of the printed wiring sheet.

(f) The semiconductor elements each comprise a cylindrical element main body made of a p type or n type semiconductor, a pn junction, and a pair of electrodes that are formed on both end parts in the axial direction of the element main boy, and that are connected to both ends of the pn junction, and the pair of electrodes are connected to the printed wiring of the printed wiring sheet.

(g) A plurality of partially spherical lens parts are formed in positions corresponding to the plurality of semiconductor elements in the surface parts of the covering material on the light receiving or light emitting side of the light receiving or light emitting panel.

(h) A plurality of partially cylindrical lens parts are formed in positions corresponding to the respective columns or respective rows of the plurality of semiconductor elements in the surface parts of the covering material on the light receiving or light emitting side of the abovementioned light receiving or light emitting panel.

(i) Reflective films for reflecting light are formed in the surface parts on the opposite side from the light receiving or light emitting side of the light receiving or light emitting panel.

(j) Printed wiring is connected to the outer edge portions that contact at least the pair of electrodes of each semiconductor element among the outer edge portions of each retaining hole of the printed wiring sheet.

(k) A pair of projecting pieces that correspond to at least the pair of electrodes of each semiconductor element, and that are bent so as to contact the pair of electrodes, are formed on the outer edge portions of the respective retaining holes of the printed wiring sheet.

(l) Both surfaces of the covering material are formed as parallel flat surfaces, and glass plates or glass sheets are disposed on these surfaces.

(m) Both surfaces of the covering material are formed as parallel flat surfaces, a glass plate or glass sheet is disposed on the flat surface on the light receiving or light emitting side, and a reflective film for reflecting light is disposed on the flat surface on the opposite side from the flat surface.

The method according to the present invention for manufacturing a light receiving or light emitting panel is a method for manufacturing a light receiving or light emitting panel in which a plurality of particulate semiconductor elements that have a light-to-electricity transducing function or electricity-to-light transducing function are incorporated in a planar fashion, this method being characterized by comprising a first step in which a plurality of semiconductor elements and a light-transmitting printed wiring sheet material are prepared, a second step in which printed wiring that is used to connect the plurality of semiconductor elements is formed on the printed wiring sheet material, a third step in which a printed wiring sheet is manufactured by punching a plurality of retaining holes in the printed wiring sheet material in the form of a matrix that has a plurality of rows and a plurality of columns, and a fourth step in which respective semiconductor elements are inserted into the plurality of retaining holes in the printed wiring sheet, to hold intermediate portions in the direction of height of these semiconductor elements, and a pair of electrodes on each semiconductor element are electrically connected to the printed wiring.

In this method for manufacturing a light receiving or light emitting panel, since a printed wiring sheet comprising printed wiring and a plurality of retaining holes disposed in the form of a matrix having a plurality of rows and a plurality of columns is prepared, a plurality of semiconductor elements are inserted into the plurality of retaining holes in this printed wiring sheet so that intermediate portions in the height direction of the semiconductor elements are held, and the pairs of electrodes of the semiconductor elements are electrically connected by the printed wiring, a light receiving or light emitting panel that possesses the various functions and advantages described above can be manufactured easily and relatively inexpensively.

In this manufacturing method, in the fourth step, it would also be possible to achieve the electrical connection of the pairs of electrodes of the semiconductor elements to the printed wiring by disposing pieces of metal with a low melting point in the vicinity of these pairs of electrodes, and irradiating these metal pieces with a heating beam.

BRIEF DESCRIPTION OF THE DRAWINGS

FIG. 16 is an enlarged plan view of the essential parts of the printed wiring sheet and solar cell in a modification;

FIG. 17 is an enlarged plan view of the essential parts of the printed wiring sheet in a modification;

FIG. 18 is an enlarged sectional view of the essential parts of the solar cell panel in a modification;

FIG. 19 is an enlarged sectional view of the essential parts of the solar cell panel in a modification;

FIG. 20 is an enlarged sectional view of the essential parts of the solar cell panel in a modification;

PREFERRED EMBODIMENT OF THE INVENTION

Embodiments of the present invention will be described below with reference to the attached drawings.

The present embodiment is an example of a case in which the present invention is applied to a solar cell panel as a light receiving panel. A method for manufacturing this solar cell panel, and the structure of this solar cell panel, will be described.

Figure 1:
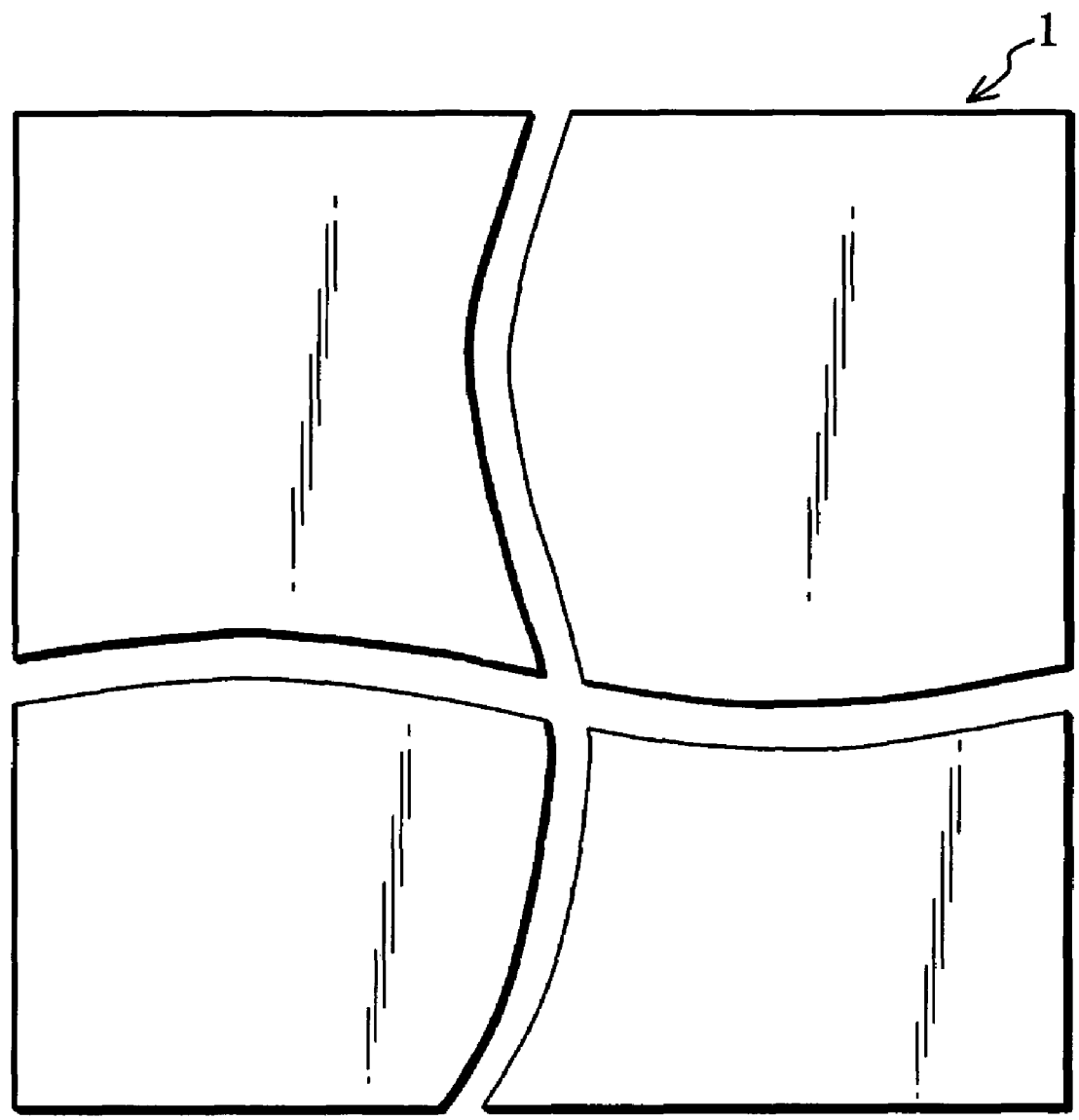
FIG. 1 is a plan view of the printed wiring sheet material in an embodiment of the present invention.

First, in a first step, the printed wiring sheet material 1 shown in FIG. 1, and numerous particulate semiconductor elements 2 (3600 elements in the present embodiment, hereafter referred to as "solar cells") that have a light-to-electricity transducing function, are prepared.

As is shown in FIG. 1, the printed wiring sheet material 1 is a flat-plate material that is formed by cutting a thin transparent sheet material such as an epoxy type synthetic resin, acrylic type synthetic resin, polyester type synthetic resin, polycarbonate or the like (for example thickness 0.4 to 0.6 mm, 0.6 mm in the present embodiment) to a size of (for example) 200 mm×200 mm.

Figure 2:
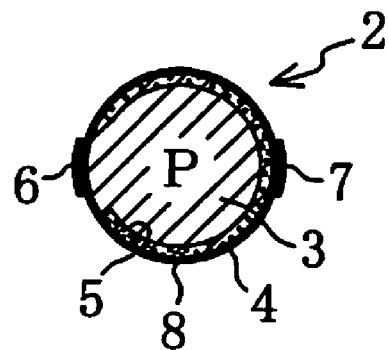
FIG. 2 is a sectional view of a solar cell.

As is shown in FIG. 2, each solar cell 2 has a spherical element main body 3 consisting of p type single crystal silicon with a diameter of (e.g.) 1.5 mm, an n type diffusion layer 4 with a thickness of approximately 0.5 μm in which phosphorus (P) is diffused in the surface portion of this element main body 3, a substantially spherical pn junction 5 which is formed at the boundary between the element main body 3 and diffusion layer 4, a pair of electrodes 6, 7 (positive pole 6 and negative pole 7) which are formed facing each other on both end parts of the element main body 3 with the center of the element main body 3 interposed, and which are connected to both ends of the pn junction 5, and an $SiO_2$ coating film 8 (thickness of approximately, 0.4 μm) used for passivation which is formed on the surface of the diffusion layer 4 except in the areas where the pair of electrodes 6, 7 are formed.

Such solar cells 2 can be manufactured for example by the method proposed by the inventor of the present application in WO 98/15983. In this manufacturing method, a small piece of p type silicon is melted, and a spherical single crystal silicon is manufactured by freely dropping this silicon from the upper end part of a dropping tube, and solidifying the silicon by radiant cooling while the silicon drops, with this silicon being maintained in a spherical shape by the action of surface tension. The diffusion layer 4, pair of electrodes 6, 7 and coating film 8 are formed on this spherical single crystal silicon by well known techniques such as etching, masking, a diffusion treatment and the like.

For example, the pair of electrodes 6, 7 are formed by respectively baking an aluminum paste or silver paste; the diameter of the electrodes 6, 7 is approximately 300 to 500 μm, and the thickness is approximately 200 to 300 μm. However, the electrodes 6, 7 may also be formed by a plating method, or may be formed by some other method. Each solar cell generates a photo-electromotive force with an open-circuit voltage of approximately 0.6 V when the cell receives sunlight with a light intensity of 100 mW/cm².

Figure 3:
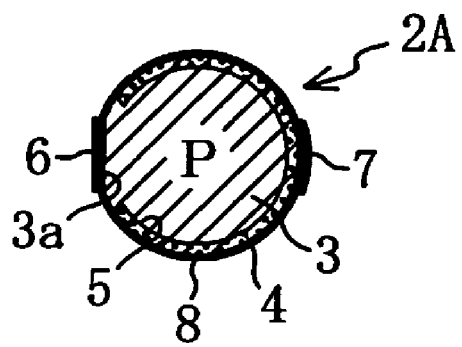
FIG. 3 is a sectional view of another solar cell.
Figure 4:
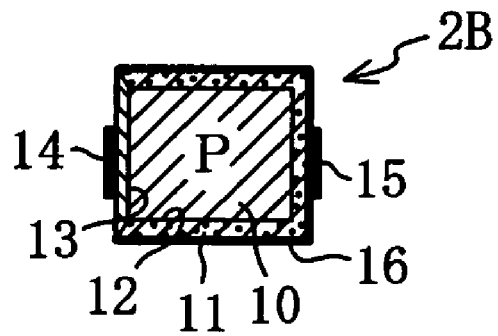
FIG. 4 is a sectional view of another solar cell.

However, the solar cells 2 may also be cells in which a p type diffusion layer is formed in an n type silicon element main body, and a pair of electrodes and coating film used for passivation similar to those described above are formed. Alternatively, for example, there may be cases in which a flat surface 3a is formed on the side of the positive pole 6 as shown in FIG. 3 in order to allow easy discrimination of the positive pole 6 and negative pole 7 of the solar cell 2A. Furthermore, the particulate semiconductor elements need not necessarily be spherical; these semiconductor elements may also be short cylindrical solar cells 2B as shown in FIG. 4. Such solar cells 2B each comprise a short cylindrical element main body 10 (e.g., 1.0 to 1.5 mm φ, 1.0 to 1.6 m L) made of p type single crystal silicon, an n type diffusion layer 11 in the surface portion of this element main body, a pn junction 12, a p+ type diffusion layer 13 with a thickness of approximately 0.2 μm formed by diffusing B (boron), a pair of electrodes 14, 15 (positive pole 14 and negative pole 15) that are formed on both end parts of the element main body 10 in the axial direction, a coating film 16 used for passivation that consists of SiO$_2$ and the like.

Figure 5:
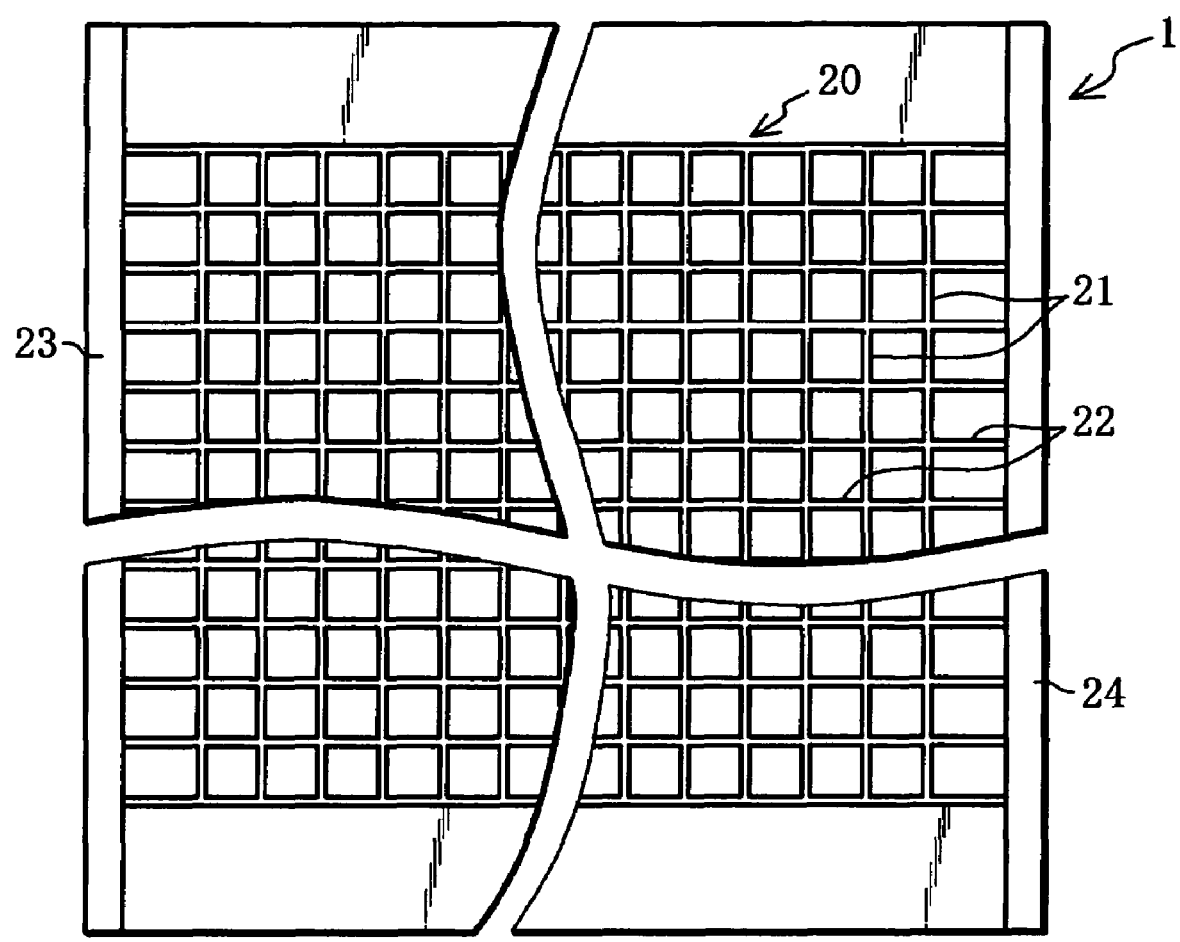
FIG. 5 is a plan view of the printed wiring sheet material on which printed wiring has been formed.

Next, in a second step, as is shown in FIG. 5, printed wiring 20 of the type shown in the figures is formed on the printed wiring sheet material 1. For example, the printed wiring 20 has a plurality of longitudinal lines 21 and a plurality of lateral lines 22 that are formed in the form of a lattice with a pitch of approximately 2.5 mm, as well as a positive pole terminal line 23 and a negative pole terminal line 24.

The printed wiring 20 is formed by forming a solder coating film (thickness 100 μm) on the surface of a copper coating film (thickness 100 μm); the line width of the longitudinal lines 21 and lateral lines 22 is approximately 500 μm, and the line width of the positive pole terminal line 23 and negative pole terminal line 24 is approximately 5.0 mm. The positive pole terminal line 23 and negative pole terminal line 24 are respectively formed on the left end part and right end part of the printed wiring sheet material 1. Furthermore, as in the case of printed wiring on an ordinary printed board, this printed wiring can be formed by laminating a copper foil, and then removing unnecessary portions by etching.

Figure 6:
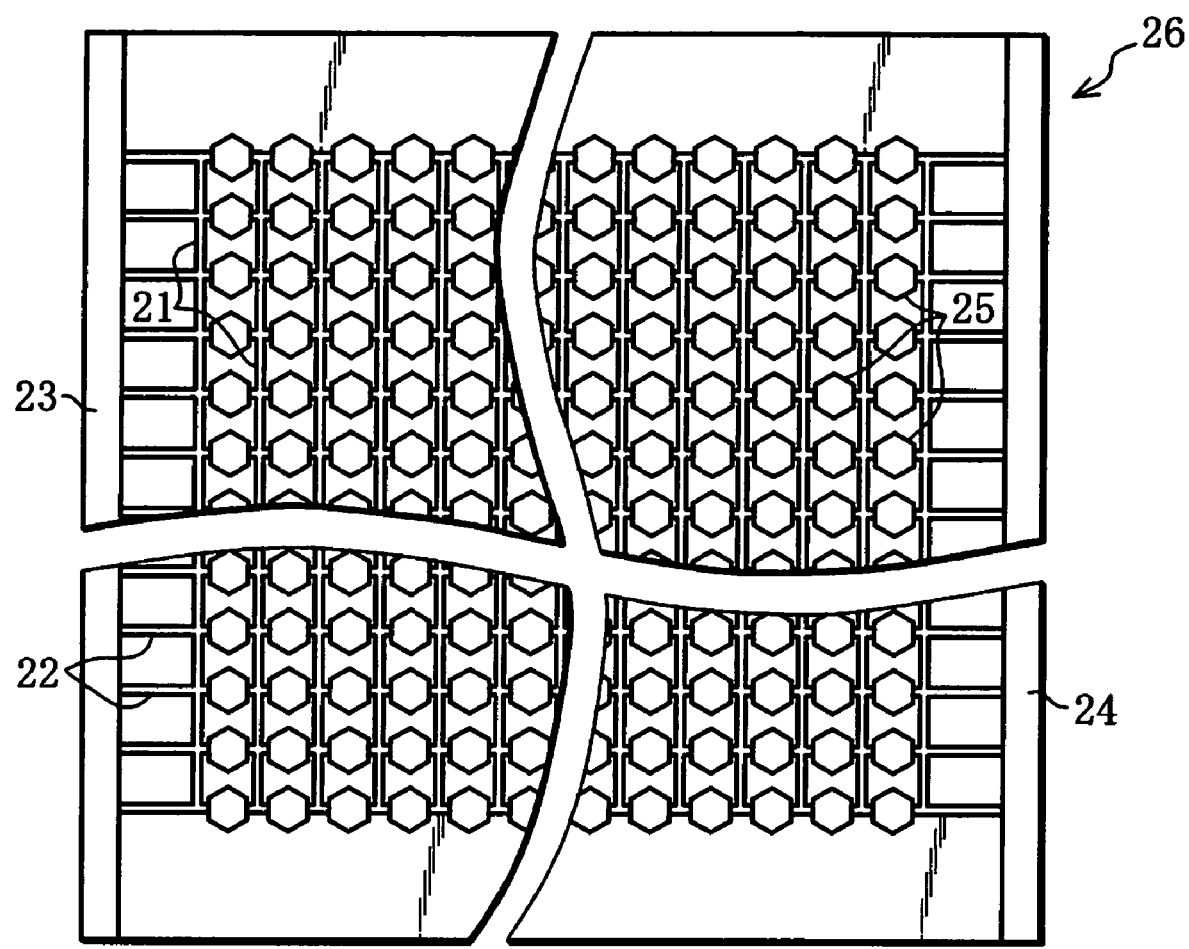
FIG. 6 is a plan view of the printed wiring sheet.
Figure 7:
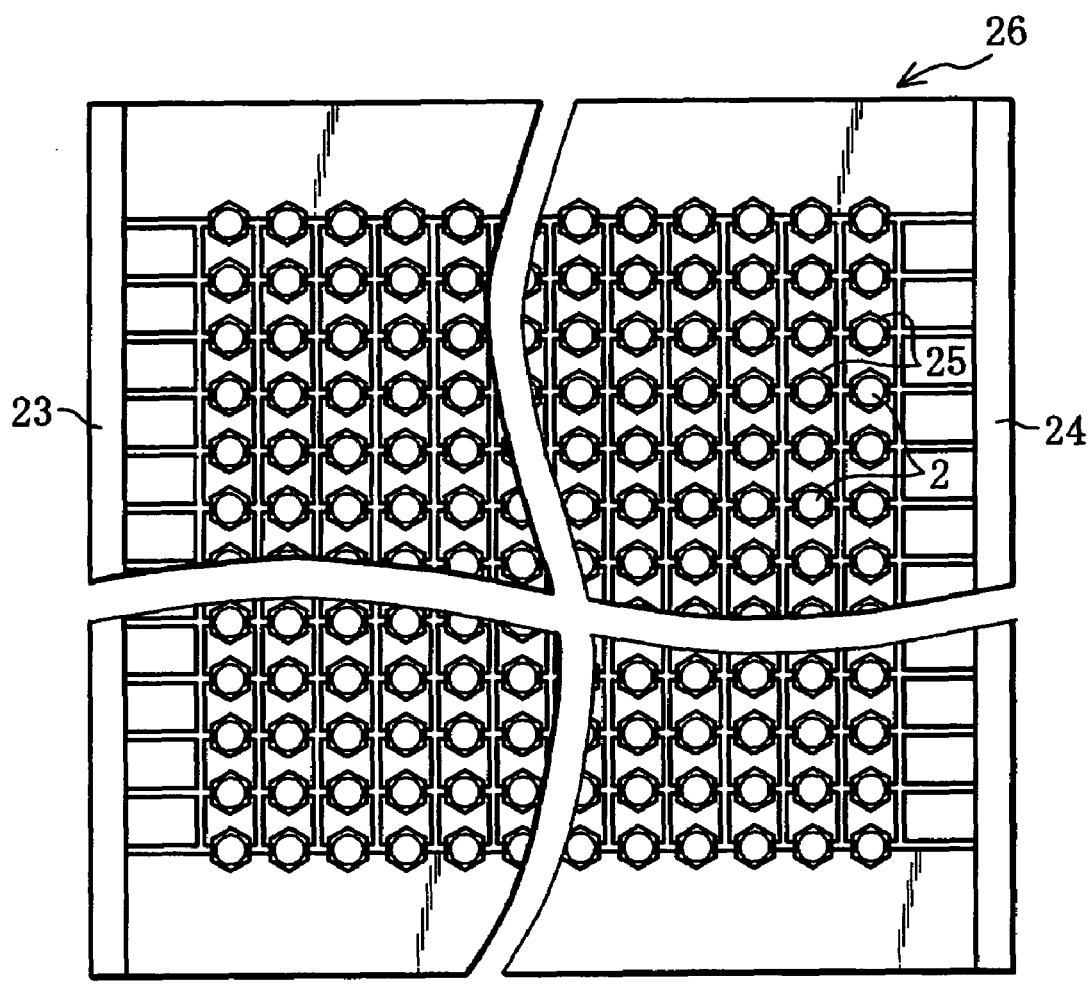
FIG. 7 is a plan view of the printed wiring sheet on which numerous solar cells have been mounted.
Figure 8:
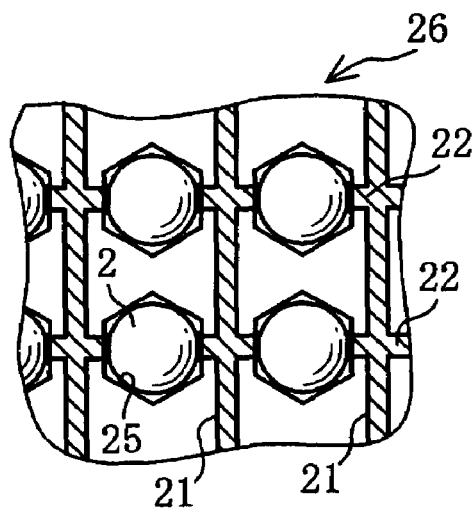
FIG. 8 is an enlarged view of the essential parts in FIG. 7.

Next, in a third step, as is shown in FIGS. 6 and 7, numerous retaining holes 25 are formed by punching in the printed wiring sheet material 1, in the form of a matrix with (for example) 60 rows and 60 columns, thus producing a printed wiring sheet 26. In this case, a specified punching die is set in a pressing machine, and punching is performed in the printed wiring sheet material 1 on which the printed wiring 20 has been formed. The retaining holes 25 are holes with a regular hexagonal shape, in which the solar cells can be inserted and held. The retaining holes 25 of each column are disposed between one longitudinal line 21 of the printed wiring 20, an the longitudinal line 21 that is adjacent to this first longitudinal line 21, and the respective retaining holes 25 in each column are disposed so as to cut across the major portions of the lateral lines 22 between the longitudinal lines 21. The lateral lines 22 are connected to the portions of the outer edge parts that contact the pairs of electrodes 6, 7 of the solar cells 2 among the outer edge parts of the retaining holes 25. However, the retaining holes 25 need not necessarily have a regular hexagonal shape; these holes may have a circular shape, square shape or some other shape.

Furthermore, a material that can be decomposed by the laser light of an excimer laser can be selected as the synthetic resin material that forms the printed wiring sheet material 1, and numerous retaining holes 25 can be simply formed with a high degree of precision by means of an excimer laser using a masking technique in combination.

Next, in a fourth step, as is shown in FIGS. 7 through 10, solar cells 2 are respectively inserted into the 3600 retaining holes 25 of the printed wiring sheet 26, so that intermediate portions in the direction of height of the solar cells 2 (intermediate portions corresponding to the electrodes 6, 7) are held, and the pairs of electrodes 6, 7 of the solar cells 2 are electrically connected to the printed wiring 20. In this case, the 3600 solar cells 2 are mounted with the direction of conduction arranged from right to left in FIG. 7, and the positive poles 6 and negative poles 7 of the respective solar cells 2 are connected to the corresponding lateral lines 22.

The 3600 solar cells 22 are disposed in the form of a matrix with 60 rows and 60 columns. The solar cells 2 of the respective rows are connected in series by the lateral lines 22, and the solar cells 2 of the respective columns are connected in parallel by the longitudinal lines 21 on both sides. In HG. 7. the positive poles 6 or the solar cells 2 of die leftmost column arc connected to the positive pole terminal line 23 by a plurality of lateral lines 22. and the negative poles 7 of the solar cells 2 of the rightmost column are connected to the negative pole terminal line 24 by a plurality of lateral lines 22.

Thus, the 3600 solar cells 2 are connected in a series-parallel connection; accordingly, even in cases where solar cells that do not operate normally are present as a result of shade or some type of trouble, the current generated by normal solar cells 2 bypasses the solar cells 2 that are not operating normally.

Figure 9:
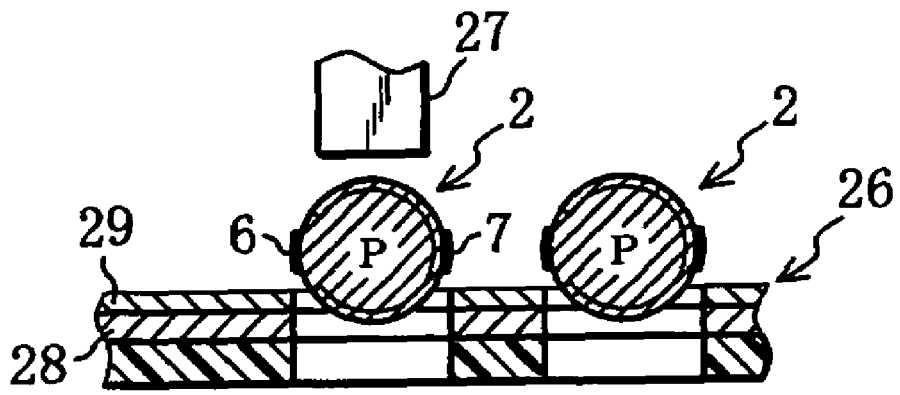
FIG. 9 is an enlarged sectional view of the essential parts of the printed wiring sheet and solar cell (at an intermediate point during mounting)
Figure 10:
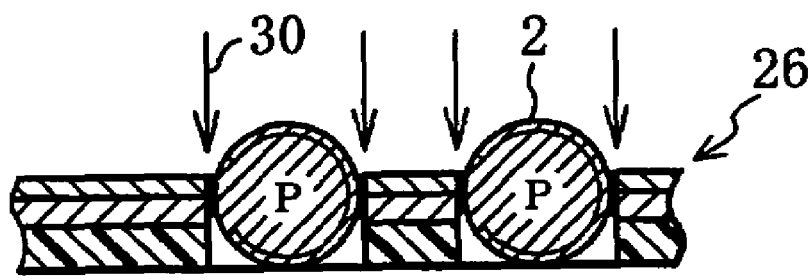
FIG. 10 is an enlarged sectional view of the essential parts of the printed wiring sheet and solar cell (following mounting)

When the respective solar cells 2 are to be mounted in the retaining holes 25, as is shown in FIG. 9, the printed wiring sheet 26 is placed on a specified assembly stand, the solar cells 2 are set in the retaining holes 25 so that the positive poles 6 of the solar cells 2 face the lateral lines 22 on the left side of the retaining holes 25, and so that the negative poles 7 face the lateral lines 22 on the right side of the retaining holes 25, and the solar cells 2 are inserted into the retaining holes 25 by being pressed from above by a pressing body 27, so that, as shown in FIG. 10, the positive poles 6 and negative poles 7 are caused to adhere tightly to the copper coating film 28 and solder coating film 29 of the corresponding lateral lines 22. Subsequently, the contact parts between the electrodes 6, 7 and the solder coating film 29 are irradiated with a beam 30 used for heating (i.e., a laser beam or infrared beam), so that the solder coating film 29 is fused to the electrodes 6, 7.

Figure 11:
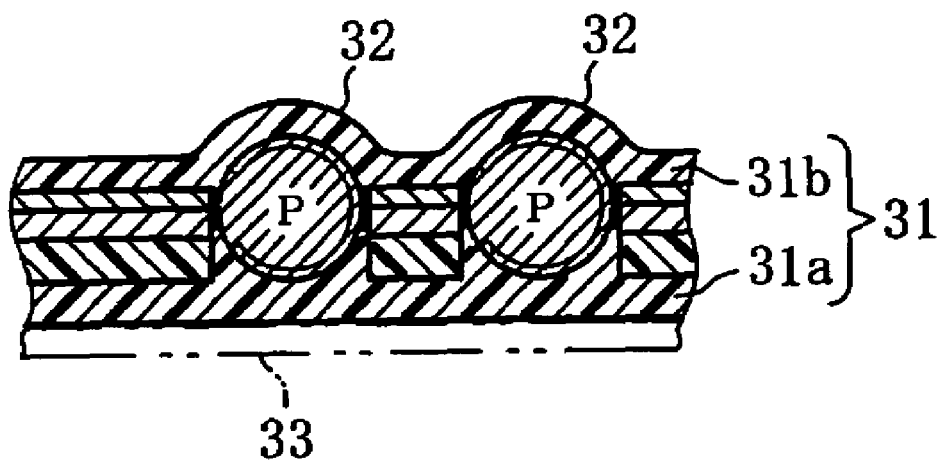
FIG. 11 is an enlarged sectional view of the essential parts of the solar cell panel.

Next, in a fifth step, as is shown in FIG. 11, a coating film consisting of a soft transparent synthetic resin material (e.g., an EVA resin, silicone resin or the like) is applied as a coating to both the upper surface and undersurface of printed wiring sheet 26 in which numerous solar cells 2 have been mounted. Then, by compression-molding these parts with an appropriate pressing force using a specified metal mold, a covering material 31 that resin-seals the numerous solar cells 2 is formed. When the printed wiring sheet 26 on which numerous solar cells 2 have been mounted is thus resin-sealed and covered in an embedded state inside the covering material 31, the solar cell panel 35 shown in FIGS. 11 and 12 is completed.

Since this solar cell panel 35 is constructed so as to receive sunlight that comes from above, the upper surface of the solar cell panel 35 is the surface of the light receiving side, and the undersurface is the surface of the anti-light receiving side. However, the covering material 31 may also be constructed from a hard transparent synthetic resin material (e.g., an acrylic type synthetic resin, epoxy type synthetic resin, polyethylene type synthetic resin, polycarbonate or the like). The covering material 31 also fills the gaps inside the respective retaining holes 25.

Figure 13:
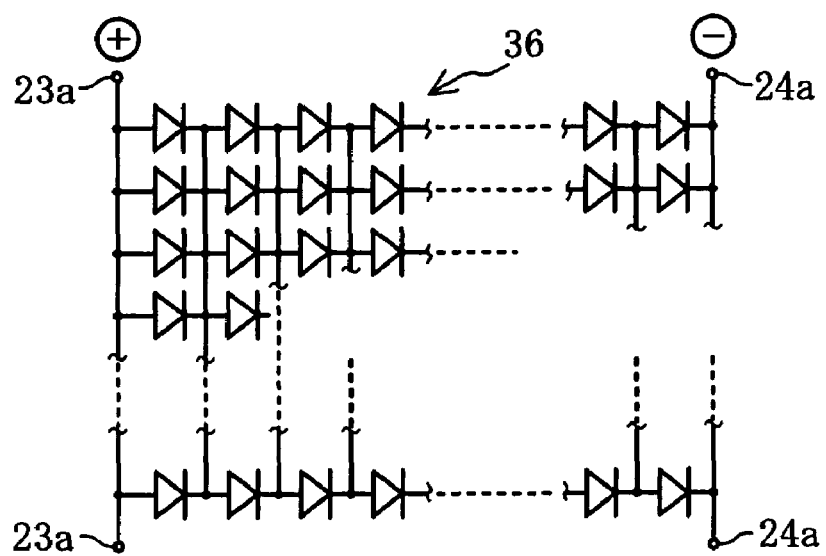
FIG. 13 is a circuit diagram of an equivalent circuit of the solar cell panel.

The thickness of the undersurface film 31a of the covering material 31 is (for example) approximately 400 to 600 μm, and the thickness of the upper surface film 31b of the covering material 31 is (for example) approximately 200 to 400 μm. In order to heighten the light receiving performance with respect to sunlight, partially cylindrical lens parts 32 that bulge outward in the direction of the upper surface are formed on the upper surfaces of the solar cells of the respective columns or respective rows. However, instead of partially cylindrical lens parts 32, it would also be possible to form partially spherical lens parts that bulge outward in the direction of the upper surfaces of the respective solar cells 2. If the solar cells 2 of this solar cell panel 35 are indicated by diode symbols in the figures, then the equivalent circuit diagram of this solar cell panel 35 is as shown in FIG. 13. 3600 solar cells 2 (indicated by diode symbols in the figures) are connected in a series-parallel connection, and both end parts of the positive pole terminal line 23 constitute positive pole terminals 23a, while both end parts of the negative pole terminal line 24 constitute negative pole terminals 24a.

Figure 12:
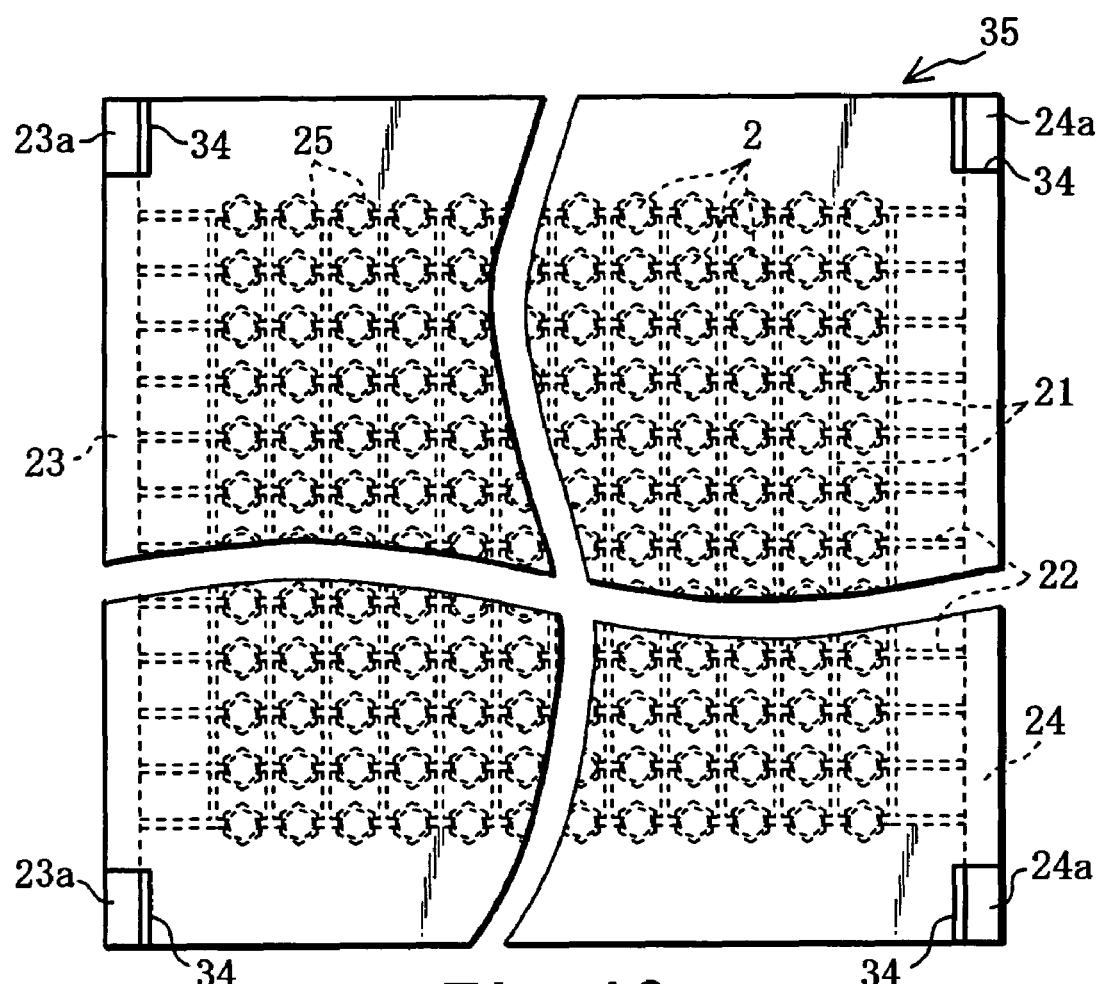
FIG. 12 is a plan view of the solar cell panel.

As is shown in FIG. 12, recessed parts 34 in which the upper surface film 31b of the covering material 31 is not formed are respectively formed in the four corner parts of the solar cell panel 35, and the positive pole terminals 23a and negative pole terminals 24a are exposed in these recessed parts 34.

Next, the functions and advantages of this solar cell panel 35 will be described.

Each solar cell 2 generates a photo-electromotive force of approximately 0.6 V when this solar cell receives sunlight with a light intensity of 100 mW/cm$^2$. Since 60 solar cells 2 are connected in series in the solar cell panel 35, the maximum voltage of the electromotive force generated by sunlight in this solar cell panel 35 is approximately 36 V.

Figure 14:
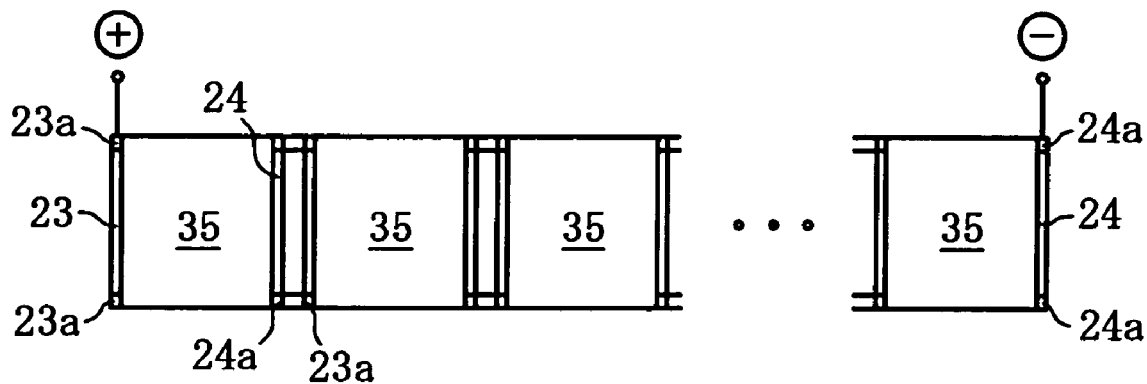
FIG. 14 is a schematic plan view of a plurality of solar cell panels connected in series.
Figure 15:
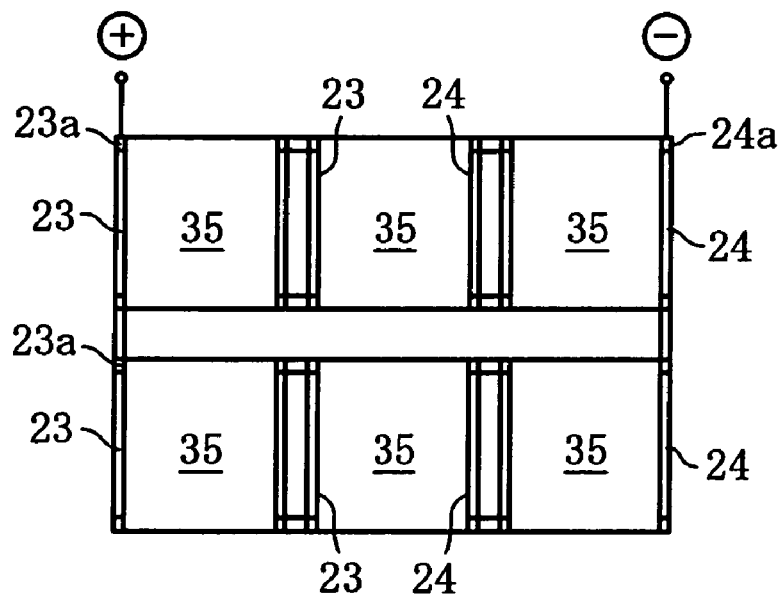
FIG. 15 is a schematic plan view of a plurality of solar cell panels connected in a series-parallel connection.

A plurality of solar cell panels 35 can be connected in series, connected in parallel or connected in a series-parallel connection via the positive pole terminals 23a and negative pole terminals 24a. FIG. 14 shows an example in which a plurality of solar cell panels 35 are connected in series, while FIG. 15 shows an example in which a plurality of solar cell panels 35 are connected in a series-parallel connection.

This solar cell panel 35 can be used in a household solar power generating system, various types of solar power generating systems used in mobile entities such as automobiles, electric trains, boats and the like, solar power generating systems used as compact power supplies in electronic equipment or electrical equipment, and other types of solar power generating systems such as chargers or the like.

Since the solar cell panel 35 has a light-transmitting structure, both light from above and light from below can be received and subjected to a light-to-electricity transducing function. However, in cases where this solar cell panel 35 is used in a solar power generating system that is installed in a fixed manner, it is desirable that a reflective film 33 or reflective plate made of metal that reflects the sunlight that is incident from above toward the solar cells 2 be disposed on the undersurface side (surface on the opposite side from the light receiving surface) of the solar cell panel 35.

The printed wiring sheet material 1 is constructed from a hard synthetic resin; however, since the covering material 31 comprises a soft synthetic resin, and since the thickness of the printed wiring sheet 26 is also small, and numerous retaining holes 25 are formed in the printed wiring sheet 26 so that this sheet is easily deformed, the solar cell panel 35 is deformable in the manner of a two dimensional or three dimensional curved surface. Accordingly, the panel can be used with the panel disposed in a state that conforms to the curved surfaces of various types of objects such as buildings or mobile entities. For example, the panel can also be used in a configuration in which the panel is bonded to the surface of an automobile body. Furthermore, since there is no need to deform the solar cell panel 35 in cases where the panel is used in a planar disposition, the covering material 31 may also be constructed from a hard synthetic resin in such cases. In this solar cell panel 35, a construction is used in which numerous solar cells 2 are incorporated on a single printed wiring sheet 26, intermediate parts in the direction of height of the respective solar cells 2 are held by the retaining holes 25, and the electrodes 6, 7 of the respective solar cells 2 are connected to the printed wiring 20; accordingly, the disposition, positioning and electrical connection of the numerous solar cells 2 can easily be accomplished. Since a single printed wiring sheet 26 is incorporated in a substantially intermediate position in the direction of thickness of the solar cell panel 35, the thickness of the solar cell panel 35 can be reduced compared to a case in which a pair of printed wiring sheets are disposed above and below the numerous solar cells 2. Consequently, the amount of synthetic resin material that is required for the covering material 31 can be reduced, the solar cell panel 35 can be made thinner and lighter in weight, and the manufacturing cost can be reduced.

Since the numerous solar cells 2 are connected in series and parallel by the printed wiring 20 of the printed wiring sheet 26, even solar cells 2 that show faulty operation due to shade or trouble are present, the current that is generated by the normal solar cells 2 bypasses the solar cells 2 that show faulty operation, so that the operating rate of the numerous solar cells 2 is increased.

Since positive pole terminals 23a are formed on both end parts of the positive pole end part of the solar cell panel 35, and negative pole terminals 24a are formed on both end parts of the negative pole end part, and since these terminals are exposed, a plurality of solar cell panels 35 can be electrically connected, so that the structure is simplified. Furthermore, since a plurality of lens parts 32 are formed on the solar cell panel 35, sunlight easily enters even if the angle of incidence of the sunlight varies; accordingly, the sunlight utilization rate can be increased.

Next, examples in which the structure of the solar cell panel 35 is partially altered will be described.

1) As is shown in FIG. 16, the retaining holes 25A that are formed in the printed wiring sheet 26A are formed in a square shape that can hold the solar cells 2, so that the width of the lateral lines 22A of the printed wiring that contact the pairs of electrodes 6 and 7 of the solar cells 2 is increased; furthermore, thick solder bumps are installed so that a construction that facilitates the electrical connection of the pairs of electrodes 6 and 7 is obtained.

2) As is shown in FIG. 17, the retaining holes 25B that are formed in the printed wiring sheet 26B have a shape that is close to a regular hexagonal shape; however, a pair of protruding parts 22a that correspond to at least the pair of electrodes 6, 7 of the solar cell 2, and which are bent when the solar cell 2 is mounted so as to contact the pair of electrodes 6, 7, are formed on the outer edge parts of each retaining hole 25B. These protruding parts 22a protrude through portions of the lateral lines 22 of the printed wiring, so that the contact area between the electrodes 6, 7 and the lateral lines 22 is increased.

3) As is shown in FIG. 18, the abovementioned lens parts 32 are omitted, and the upper surfaces of the upper surface films 31c of the covering material 31 are formed as flat planes. This solar cell panel 35A is suitable for use in a state in which the panel is clamped between flat plates of glass or the like. Furthermore, as is shown in FIG. 19, a reflective film 40 that reflects light from above toward the solar cells 2 may be formed on the undersurface of this solar cell panel 35B.

4) In this solar cell panel 35C, as is shown in FIG. 20, a reflective film 41 made of metal that reflects light from above toward the solar cells 2, and that has a transparent insulating film formed on the upper surface side, is bonded to the undersurface on the opposite side from the light receiving side, and a covering material 42 similar to the upper surface film 31*b* of the abovementioned covering material 31 is disposed on the upper surface on the light receiving side. For example, the reflective film 41 is constructed from a thin sheet or film material made of stainless steel; however, this reflective film 41 may also be constructed from aluminum foil. However, the covering material 42 may also be constructed from a synthetic resin similar to the abovementioned covering material 31, or may be constructed from a hard transparent synthetic resin (e.g., an epoxy type synthetic resin, acrylic type synthetic resin or the like).

Figure 21:
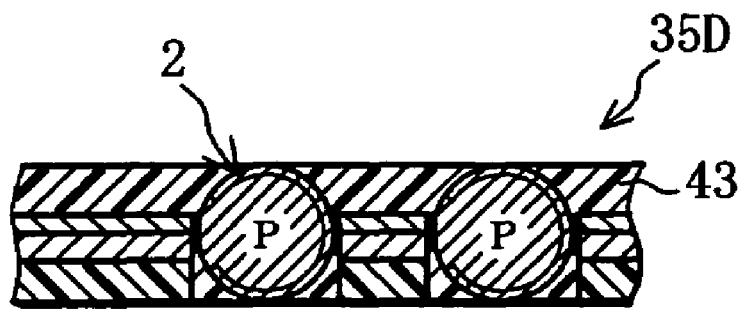
FIG. 21 is an enlarged sectional view of the essential parts of the solar cell panel in a modification.

5) In the solar cell panel 35D shown in FIG. 21, a covering material 43 comprising a soft transparent synthetic resin is disposed only on the light receiving surface side; the upper surface on the light receiving surface side of the covering material 43 is formed as a flat surface at substantially the same level as the upper ends of the solar cells 2, and the undersurface on the anti-light receiving side of the covering material 43 is formed as a flat surface at substantially the same level as the undersurfaces of the solar cells 2. Since this solar cell panel 35D is thin and light-weight, a solar power generating unit that is suitable for use in the portable power supplies of electronic devices (personal computers, portable telephones or the like) can be manufactured.

Figure 22:
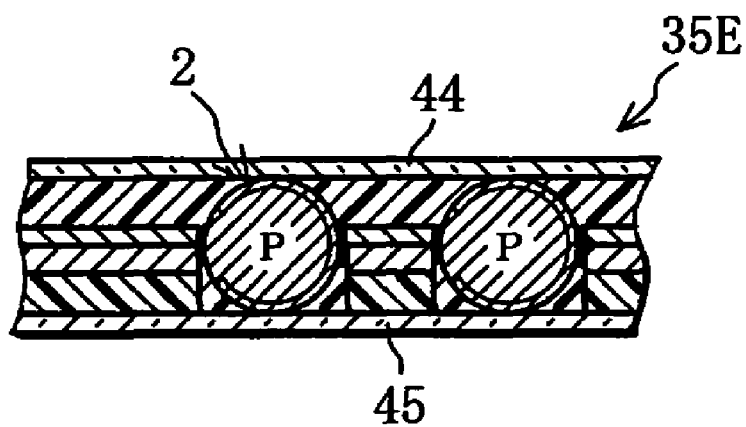
FIG. 22 is an enlarged sectional view of the essential parts of the solar cell panel in a modification.
Figure 23:
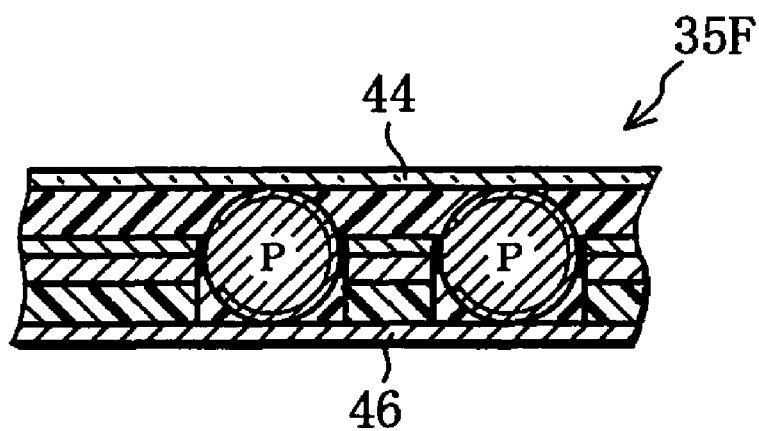
FIG. 23 is an enlarged sectional view of the essential parts of the solar cell panel in a modification.

The solar cell panel 35E shown in FIG. 22 is a panel in which thin reinforcing glass sheets 44 and 45 are bonded to the upper surface and undersurface of a solar cell panel with a structure similar to that shown in FIG. 21 in order to protect the surfaces. The solar cell panel 35F shown in FIG. 23 is a panel in which a metal reflective film 46 or reflective plate is bonded instead of the undersurface reinforcing glass sheet 45 in the solar cell panel 35E shown in FIG. 22.

Figure 24:
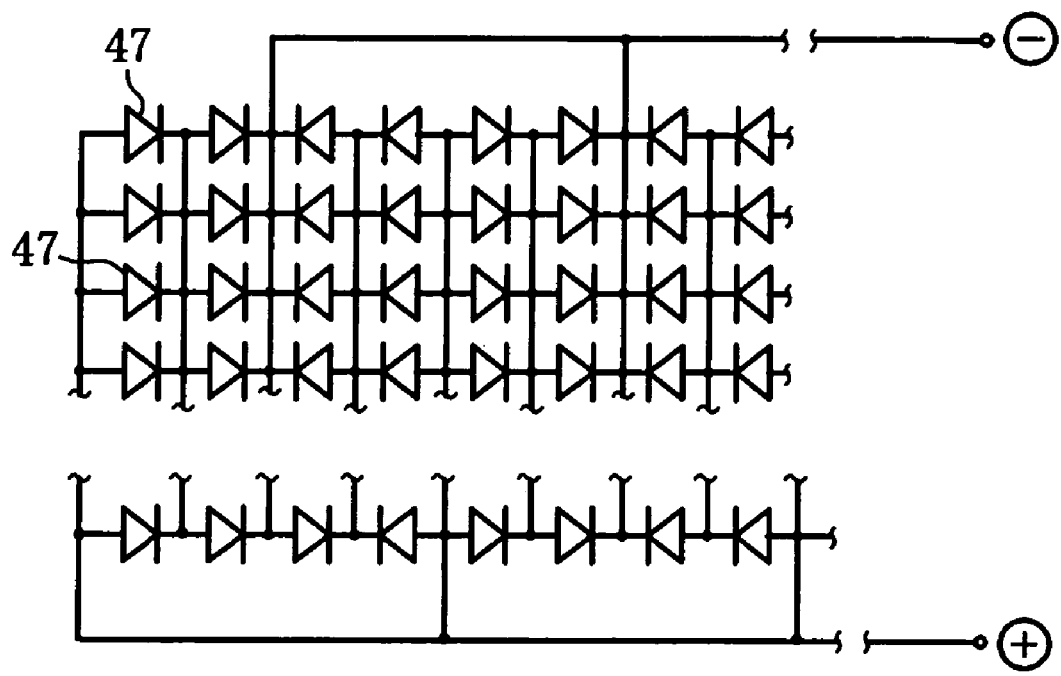
FIG. 24 is a circuit diagram of an equivalent circuit of the solar cell panel in a modification.
Figure 25:
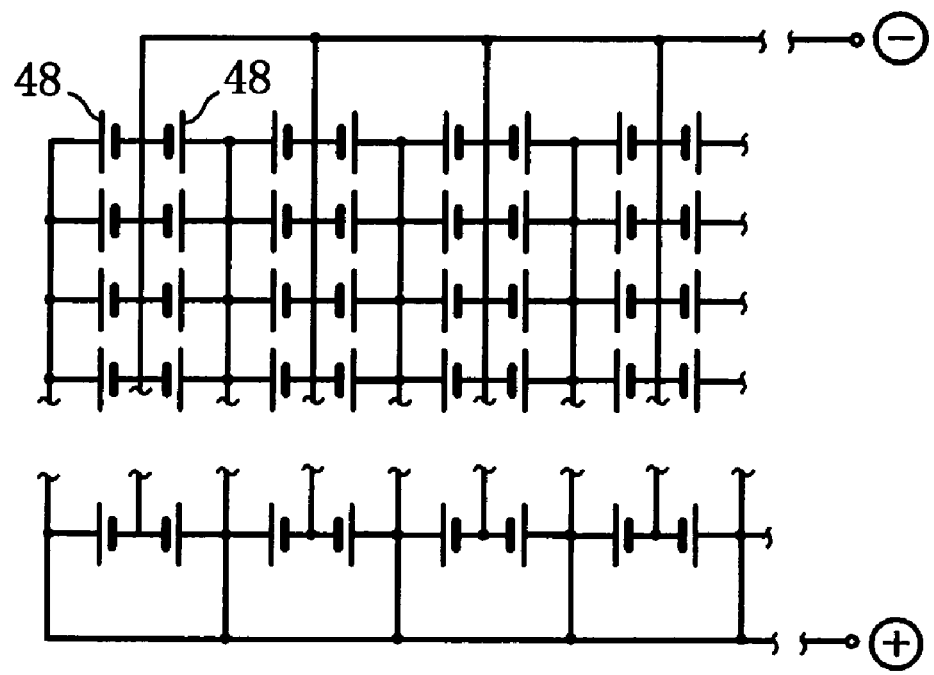
FIG. 25 is a circuit diagram of an equivalent circuit of the solar cell panel in a modification.

6) FIG. 24 shows a modification of the equivalent circuit of the solar cell panel. If the photo-electromotive force of the solar cells 2 (indicated as diodes 47 in the figures) is designated as Eo, then the output voltage of this solar cell panel is 2Eo. FIG. 25 shows another modification of the equivalent circuit of the solar cell panel. A plurality of cells 48 are disposed in the form of a matrix with a plurality of rows and a plurality of columns. A single cell 48 is an entity in which a plurality of solar cells 2 are connected in series; if the electromotive force of this cell is designated as E1 (V), then the output voltage of the solar cell panel is also E1 (V). Thus, electrical circuits in which the solar cells 2 of the plurality of rows and plurality of columns of the solar cell panel are connected in series and parallel can be constructed in various configurations, so that electrical circuits that are suited to the photo-electromotive force required can be constructed.

7) Various types of transparent synthetic resin materials (e.g., epoxy type synthetic resins, acrylic type synthetic resins, silicone resins, polyethylene type synthetic resins, polycarbonates, polyimides, methacrylic resins and the like) can be used as the synthetic resin material that forms the covering material in the abovementioned solar cell panels. Alternatively, the abovementioned printed wiring sheet material 1 can be constructed from a soft transparent synthetic resin, and the abovementioned covering material can also be constructed from a soft transparent synthetic resin material.

8) In the abovementioned embodiments, solid solar cells 2 were described as an example. However, hollow solar cells (not shown in the figures) that have a light-to-electricity transducing function may also be used.

Such hollow solar cells are cells in which the element main body 3 consisting of p type (or n type) silicon is hollow. In cases where such hollow element main bodies are manufactured, p type silicon melted in a quartz crucible is dropped as liquid droplets containing gas bubbles inside a dropping tube from the tip end of a quartz nozzle, and these liquid droplets are solidified into a spherical shape while being dropped. In this case, liquid droplets containing gas bubbles can be formed by filling the interiors of the liquid droplets of molten silicon with a specified amount of an inert gas such as argon or the like immediately prior to the dropping of the molten p type silicon inside the dropping tube from the tip end of the quartz nozzle.

9) In the solar cell panels 35 of the abovementioned embodiments, solar cells 2 were mounted in all of the retaining holes 25 of the printed wiring sheet 26. However, it would also be possible to mount conductive spherical bodies (not shown in the figures) made of metal instead of the abovementioned solar cells 2 in some of the retaining holes 25, and to lead out lead wires from these conductive spherical bodies, thus constructing the system so that a photo-electromotive force with the desired voltage is extracted. Alternatively, if necessary, a construction may be used in which insulating spherical bodies made of an insulating material (not shown in the figures) are mounted in some of the retaining holes 25 so that the longitudinal lines 21 of the printed wiring are segmented.

10) In regard to the solar cells 2 of the abovementioned solar cell panels, a case in which silicon was used as the semiconductor was described as an example; however, p type or n type Ge can also be used as the semiconductor that forms the element main bodies of the solar cells 2, and various types of compound semiconductors (e.g., GaAs, GaSb, InSb, InP, InAs or the like) can also be used.

11) An inverter circuit that converts the direct-current power generated by the solar cell panel into alternating-current power, and various types of switches, wiring and the like, can be incorporated in the extra space on the outer circumferential side of the solar cell panel.

12) In the abovementioned embodiments, a solar cell panel 35 used as a light receiving panel, which used solar cells 2 as particulate semiconductor elements, was described as an example. However, particulate light-emitting diodes that have an electricity-to-light transducing function can be used instead of solar cells 2. If a construction is used in which such light-emitting diodes are connected in series in a plurality of stages, and a substantially specified direct-current voltage is applied to the light-emitting diodes of the respective stages, a light-emitting panel or display that shows surface light emission can be constructed.

The method used to manufacture such particulate light-emitting diodes (spherical light-emitting diodes) is similar to the method proposed by the inventor of the present application in WO 98/15983; accordingly, the structure of these spherical light-emitting diodes will be briefly described here.

Figure 26:
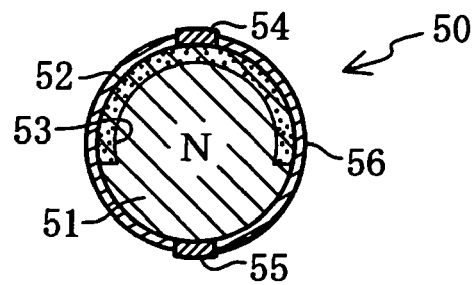
FIG. 26 is sectional view of a spherical light-emitting diode.

As is shown in FIG. 26, a spherical light-emitting diode 50 comprises an element main body 51 consisting of n type GaAs with a diameter of 1.0 to 1.5 mm, a substantially spherical-surface form p type diffusion layer 52 that is formed in the vicinity of the surface of the element main body 51, a substantially spherical-surface form pn junction 53, an anode 54 and cathode 55, a fluorescent coating film 56 and the like. The element main body 51 is constructed from n type GaAs to which Si is added so that the peak wavelength of the infrared light generated by the pn junction 53 is 940 to 980 nm. The p type diffusion layer 52 is formed by thermally diffusing a p type impurity such as Zn; the impurity concentration at the surface of the p type diffusion layer is 2 to $8 \times 10^{19}/cm^3$.

The fluorescent coating film 56 uses different fluorescent substances according to the color of the light that is emitted. $Y_{0.74}Yb_{0.25}Er_{0.01}OCl$ is used as a fluorescent substance that generates red light, $Y_{0.84}Yb_{0.15}Er_{0.01}F_3$ is used as a fluorescent substance that generates green light, and $Y_{0.65}Yb_{0.35}Tm_{0.001}F_3$ is used as a fluorescent substance that generates blue light. The abovementioned anode 54 (thickness 1 μm) is constructed from Au to which 1% Zn is added, and the cathode 55 (thickness 1 μm) is constructed from Au to which small amounts of Ge and Ni are added.

In such a particulate light-emitting diode 50, when a voltage of approximately 1.4 V is applied to the cathode 55 from the anode 54, infrared light with a wavelength of approximately 940 to 980 nm is generated from the pn junction of the GaAs, and the fluorescent substance of the fluorescent coating film 56 is excited by this infrared light so that the infrared light is converted into visible light (red light, green light or blue light) that corresponds to the fluorescent substance, and this visible light is output to the outside from the entire surface of the fluorescent coating film 56.

For example, in a case where light-emitting diodes that generate red light are mounted in all of the retaining holes 25 of the printed wiring sheet 26, the 60 light-emitting diodes of each row are connected in series, and a direct-current voltage of approximately 60×1.4 V is applied to the terminal on the anode side from the terminal on the cathode side, a light emitting panel is obtained in which red light is emitted by surface light emission from 3600 light-emitting diodes. A light emitting panel that generates green light and a light emitting panel that generates blue light can be similarly constructed.

Furthermore, a light emitting panel that can be used as a display for displaying characters, symbols and images in a single color or a plurality of colors can also be constructed. A color display or color television in which light-emitting diodes for the abovementioned R, G and B (red, green and blue) are incorporated can also be constructed as proposed in the abovementioned WO 98/15983. Here, the types and combinations of light-emitting diodes that are incorporated in the light emitting panel, and the disposition configuration of the plurality of light-emitting diodes, are set in accordance with the size and function of the display or television. Furthermore, the diameter of the element main bodies 51 of the particulate light-emitting diodes 50 are not limited to the value described above; this diameter may also be set at a value that is less than 1.0 mm, or a value that is greater than 1.5 mm. Furthermore, hollow element main bodies can also be used as the element main bodies 51 of the abovementioned spherical light-emitting diodes 50; alternatively, element main bodies in which insulating spherical bodies consisting of an insulating material are incorporated instead of hollow parts may also be used.

Furthermore, instead of the GaAs used as the semiconductor forming the abovementioned element main bodies, GaP, GaN or various other types of semiconductors can be utilized as the semiconductor used in the abovementioned light-emitting diodes.

Figure 27:
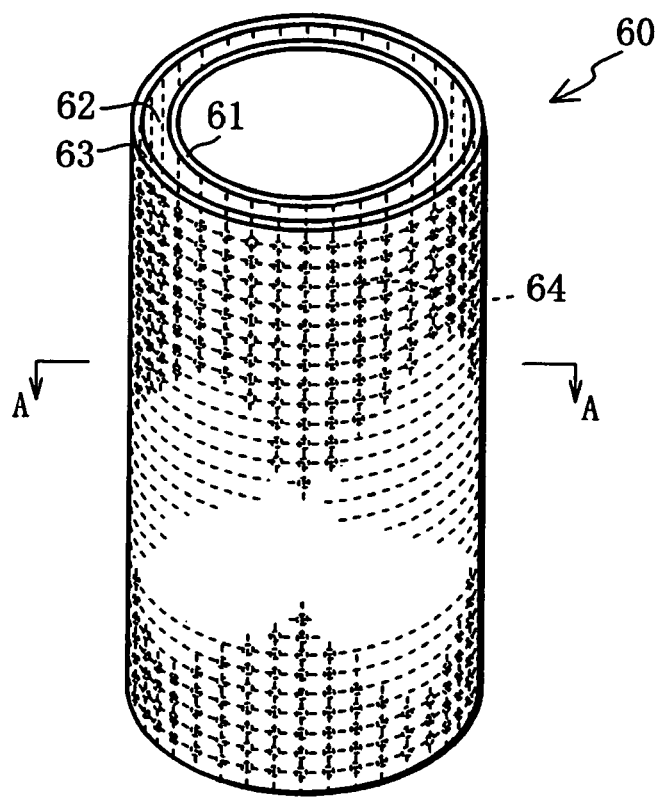
FIG. 27 is a perspective view of the light emitting device in a modification.
Figure 28:
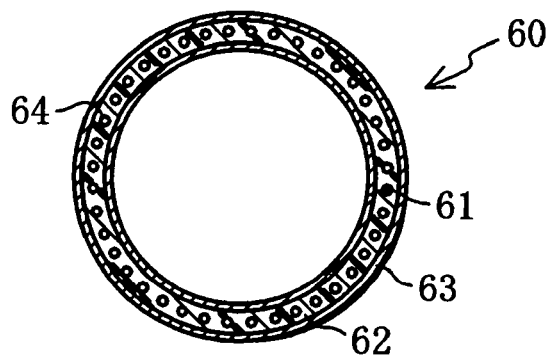
FIG. 28 is a sectional view along A-A line in FIG. 27.

13) In cases where a light emitting panel such as that described in the abovementioned section 12) is constructed with a structure that can be deformed in the manner of a two dimensional or three dimensional curved surface, a cylindrical light emitting device 60 such as that shown in FIG. 27 or FIG. 28 can be constructed using this light emitting panel.

This light emitting device 60 is constructed from an inner tube 61 that is formed from glass, a transparent or opaque synthetic resin, a metal or the like, a light emitting panel 62 that is bent into a cylindrical form and bonded to the surface of this inner tube 61, an outer tube 63 used as a surface protecting body made of glass or a transparent synthetic resin that is fit over this light emitting panel 62. As in the case of the abovementioned solar cell panel, a plurality of semiconductor elements 64 that have an electricity-to-light transducing function are mounted in this light emitting panel 62 in the form of a matrix that has a plurality of rows and a plurality of columns.

Here, however, instead of the inner tube 61, it would also be possible to use a semi-cylindrical body, partially cylindrical body, hollow spherical body, semi-hollow spherical body, partially hollow spherical body or curved-surface body with a curved surface consisting of the same material as that described above, and to use a construction in which a light emitting panel is bonded to the surface of one of these bodies, and a surface protecting body made of glass or a transparent synthetic resin is bonded to the surface of this light emitting panel.

Furthermore, the above description used a light emitting device as an example; however, it would also be possible to realize light receiving devices of the various configurations described above by using a light receiving panel instead of a light emitting panel.

The invention claimed is:

1. A light receiving or light emitting panel, comprising:
   a plurality of granular semiconductor elements that have a light-to-electricity transducing function or electricity-to-light transducing function;
   a light transmitting printed wiring sheet comprising:
      a first flat surface;
      a plurality of retaining holes disposed in a form of a matrix having a plurality of rows and a plurality of columns, and
      printed wiring which is formed on said first flat surface;
   said semiconductor elements each comprising:
      an element main body made of a p type or n type semiconductor,
      a pn junction, and
      a pair of electrodes that are electrically connected to respective ends of the pn junction with a center of the element main body interposed between the electrodes; and
   the plurality of semiconductor elements being aligned in a common conductive direction and being respectively disposed and held in said retaining holes,
   the pair of electrodes of each semiconductor element being connected to said printed wiring;
   plural semiconductor elements, of said granular semiconductor elements, in each row or column parallel to said conductive direction being connected in series via said printed wiring; and
   plural semiconductor elements, of said granular semiconductor elements, in each column or row perpendicular to said conductive direction being connected in parallel via said printed wiring.

2. The light receiving or light emitting panel according to claim 1 wherein said light transmitting printed wiring sheet has a second surface opposing said first flat surface and lower portions of the semiconductor elements extend below the second surface.

3. A light receiving or light emitting panel according to claim 1, wherein a transparent covering material is provided which covers in embedded form said printed wiring sheet and the plurality of semiconductor elements held by the printed wiring sheet.

4. A light receiving or light emitting panel according to claim 3, wherein said printed wiring sheet is constructed from a thin sheet material made of a transparent hard synthetic resin.

5. A light receiving or light emitting panel according to claim 3, wherein said covering material is a hard synthetic resin material forming a hard flat-plate structure.

6. A light receiving or light emitting panel according to claim 3, wherein, for at least a plurality of said semiconductor elements, the element main body and the pn junction are spherical and said pair of electrodes are connected to the printed wiring of the printed wiring sheet.

7. A light receiving or light emitting panel according to claim 3, wherein, for at least a plurality of said semiconductor elements, the element main body and the pn junction are cylindrical and said pair of electrodes are connected to the printed wiring of the printed wiring sheet.

8. A light receiving or light emitting panel according to claim 3, wherein a plurality of partially spherical lens parts are formed in positions corresponding to the plurality of semiconductor elements in surface parts of the covering material on a light receiving or light emitting side of said light receiving or light emitting panel.

9. A light receiving or light emitting panel according to claim 3, wherein a plurality of partially cylindrical lens parts are formed in positions corresponding to respective columns or respective rows of the plurality of semiconductor elements in surface parts of the covering material on a light receiving or light emitting side of said light receiving or light emitting panel.

10. A light receiving or light emitting panel according to claim 3, wherein both surfaces of said covering material are formed as parallel flat surfaces, a glass plate or glass sheet is disposed on a flat surface of said flat surfaces on a light receiving or light emitting side, and a reflective film for reflecting light is disposed on another flat surface of said flat surfaces on an opposite side from said flat surface.

11. The light receiving or light emitting panel according to claim 3, wherein reflective films for reflecting light are formed in surface parts on an opposite side from a light receiving or light emitting side of said light receiving or light emitting panel.

12. A light receiving or light emitting panel according to claim 3, wherein said covering material is a soft synthetic resin material, and the light receiving or light emitting panel is constructed with a structure deformable into a curved surface wherein said rows or said columns are curved.

13. A light receiving or light emitting panel according to claim 12, wherein a pair of projecting pieces that correspond to at least a pair of electrodes of each semiconductor element, and that are bent so as to contact the pair of electrodes, are formed on an outer edge portions of the respective retaining holes of said printed wiring sheet.

14. A light transducing panel, comprising:
  semiconductor elements that have a light-to-electricity transducing function or electricity-to-light transducing function;
  a light transmitting printed wiring sheet functioning to position, hold and electrically connect said semiconductor elements;
  the printed wiring sheet comprising:
    a flat material having a first flat surface;
    a plurality of retaining holes disposed in said first flat surface in a form of a matrix having a plurality of rows and a plurality of columns, the semiconductor elements being respectively disposed in said retaining holes, and
    printed wiring which is formed on said first flat surface which electrically connects the semiconductor elements:
  said semiconductor elements each having an element main body made of a p type or n type semiconductor, a pn junction, and a pair of electrodes that are electrically connected to respective ends of the pn junction; and
  the printed wiring of the printed wiring sheet connecting the pairs of electrodes in a configuration wherein:
    the pn junctions of the semiconductor elements in each of the rows are electrically connected in series with each other of the pn junctions of the semiconductor elements in respective ones of the rows such that, for each of the rows, the pn junctions in the row are serially connected with each other; and
    the pn junctions of the semiconductor elements of each of the columns are electrically connected in parallel with each other of the pn junctions of the semiconductor elements in respective ones of the columns such that, for each of the columns, the pn junction of the semiconductor elements in the column are connected in parallel with each other.

15. The panel of claim 14 wherein said semiconductor elements have upper and lower portions respectively disposed above and below said first flat surface, and intermediate parts between said upper and lower portions which are connected to said hat material.

16. The panel of claim 14 wherein said pairs of electrodes have a center of the element main body interposed between the electrodes.

17. A light receiving or light emitting panel in which a plurality of particulate semiconductor elements that have a light-to-electricity transducing function or electricity-to-light transducing function are incorporated in a planar fashion, characterized in that a light transmitting printed wiring sheet that is used to position, hold and electrically connect said plurality semiconductor elements is provided, and the printed wiring sheet comprises:
  a plurality of retaining holes disposed in a form of a matrix having a plurality or rows and plurality of columns, through which a plurality of semiconductor elements are passed, and which hold intermediate parts in a height direction of the semiconductor elements,
  printed wiring which is formed on a surface of the printed wiring sheet which electrically connects the plurality of semiconductor elements,
  wherein a reflective film for reflecting light is formed in surface parts on an opposite side from a light receiving or light emitting side of said light receiving or light emitting panel.

18. A light receiving or light emitting panel in which a plurality of particulate semiconductor elements that have a light-to-electricity transducing function or electricity-to-light transducing function are incorporated in a planar fashion, characterized in that a light transmitting printed wiring sheet that is used to position, hold and electrically connect said plurality of semiconductor elements is provided, and the printed wiring sheet comprises:
  a plurality of retaining holes disposed in a form of a matrix having a plurality of rows and a plurality a columns, through which a plurality of semiconductor elements are passed, and which hold intermediate parts in a height direction of the semiconductor elements, and printed wiring which is formed on a surface of the printed wiring sheet which electrically connects the plurality of semiconductor elements, a transparent covering material is provided which covers in embedded form said printed wiring sheet and the plurality of semiconductor elements held by the printed wiring sheet;

wherein both surfaces of said covering material are formed as parallel flat surfaces, and glass plates or glass sheet are disposed on these surfaces.

19. A method for manufacturing a light receiving or light emitting panel in which a plurality of particulate semiconductor elements that have a light-to-electricity transducing function or electricity-to-light transducing function are incorporated in a planar fashion, this method being characterized by comprising:

a first step in which a plurality of semiconductor elements and a light-transmitting printed wiring sheet material are prepared;

a second step in which a printed wiring for connecting said plurality of semiconductor elements is formed on said printed wiring sheet material;

a third step in which a printed wiring sheet is manufactured by punching a plurality of retaining holes in said primed wiring sheet material in a form of a matrix that has a plurality of rows and a plurality of columns; and a fourth step in which respective semiconductor elements are inserted into the plurality of retaining holes in said printed wiring sheet, to hold intermediate portions in a direction of height of these semiconductor elements, and a pair of electrodes on each semiconductor element are electrically connected to said printed wiring.

20. A light receiving or light emitting panel manufacturing method according to claim 19, wherein a pair of electrodes of each semiconductor element are electrically connected to said printed wiring by disposing pieces of metal with a low melting point in the vicinity of this pair of electrodes, and irradiating these metal pieces with a heating beam.

* * * * *